United States Patent [19]

Taniguchi et al.

[11] Patent Number: 4,907,123
[45] Date of Patent: Mar. 6, 1990

[54] ELECTROMECHANICAL TRANSDUCER TYPE RELAY

[75] Inventors: Tsutomu Taniguchi; Ryuichi Sato; Masatoshi Ohba, all of Kyoto, Japan

[73] Assignee: Omron Tateisi Electronics Co., Kyoto, Japan

[21] Appl. No.: 171,193

[22] Filed: Feb. 29, 1988

Related U.S. Application Data

[63] Continuation-in-part of Ser. No. 13,109, Feb. 10, 1987, abandoned.

[30] Foreign Application Priority Data

Feb. 10, 1986 [JP] Japan .................................. 61-27724
Feb. 10, 1986 [JP] Japan .................................. 61-27725

[51] Int. Cl.⁴ ........................................... H01H 47/26
[52] U.S. Cl. ................................... 361/211; 200/181; 310/330
[58] Field of Search ............... 361/156, 153, 207, 211; 200/181; 310/317, 330–332

[56] References Cited

U.S. PATENT DOCUMENTS 4,544,988 10/1985 Hochstein ........................... 361/211
4,553,061 11/1985 Germano ............................ 310/332
4,603,242  7/1986 Atsumi et al. ...................... 200/181

FOREIGN PATENT DOCUMENTS

2811529  9/1979 Fed. Rep. of Germany ...... 310/332

*Primary Examiner*—L. T. Hix
*Assistant Examiner*—David M. Gray
*Attorney, Agent, or Firm*—Wegner & Bretschneider

[57] ABSTRACT

This invention relates to an electromechanical transducer type relay which opens and closes contacts using electromechanical transducer elements, such as electrostrictive elements or piezoelectric elements, which produce strains when subjected to an electric field.

5 Claims, 10 Drawing Sheets

ic type relay which opens and closes contacts using
ELECTROMECHANICAL TRANSDUCER TYPE RELAY This application is a continuation-in-part of Application Ser. No. 013,109, filed Feb. 10, 1987, now abandoned.

BACKGROUND OF THE INVENTION

1. Field of the Invention

This invention relates to an electromechanical transducer type relay which opens and closes contacts using electromechanical transducer elements, such as electrostrictive elements or piezoelectric elements, which produce strains when subjected to an electric field.

2. Description of the Relevant Art

Figure 1A:
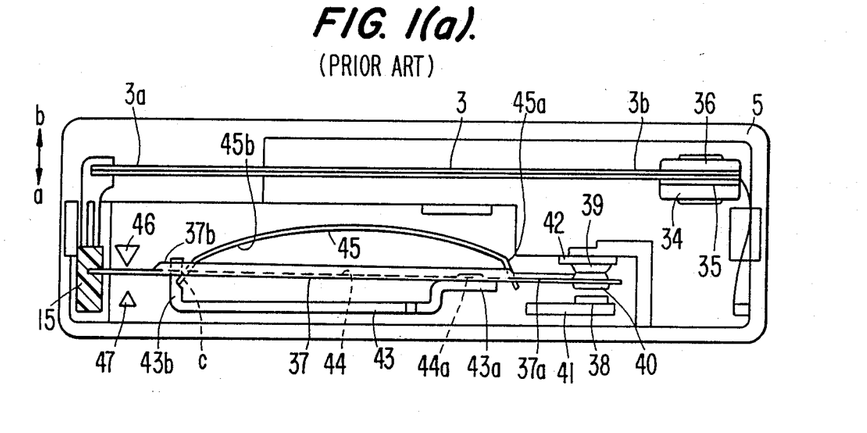
FIGS. 1(a) and 1(b) are top planar views showing the prior art of the electromechanical transducer-type relay.
Figure 1B:
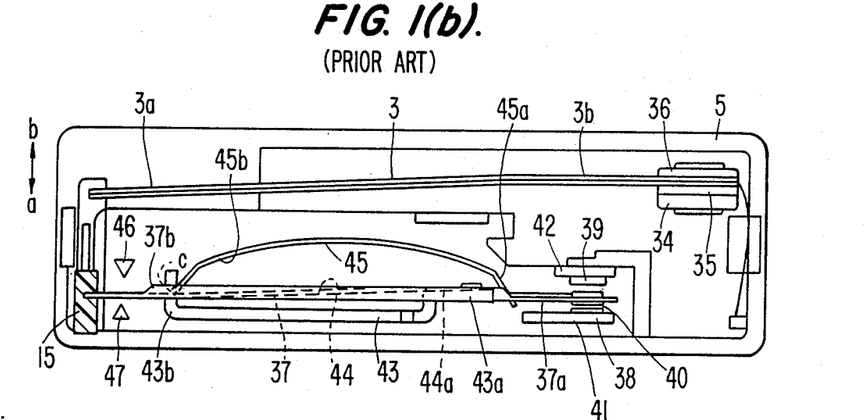
Figure 2:
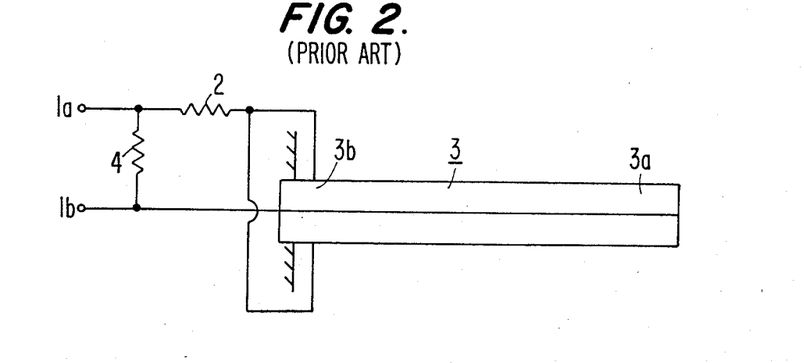
FIG. 2 is an electric circuit diagram of the prior art electromechanical transducer-type relay.

FIGS. 1(a) and 1(b) are views showing an example of a prior art electromechanical transducer type relay. In these figures reference numeral 3 denotes a bimorph cell which comprises a pair of joined dielectric electromechanical transducer elements, for example, of electrostrictive elements, which generates strain when subjected to an electric field. It is cantilevered at its base portion 3b by a fixed member 34 fixed to a base 5 and is electrically connected via lead members 35, 36 to a printed board (not shown) in which an electronic circuit shown in FIG. 2 is built. When a voltage is applied to bimorph cell 3, the movable end 3a of bimorph cell 3 is bent with a fixed member 34 as a supporting point in the direction of the arrow a or b.

Reference numeral 37 denotes a movable contact member which has at its end 37a a movable contact member 40 which can move to and away from fixed contacts 38, 39 which are provided to fixed terminals 41, 42, respectively. Reference numeral 43 denotes a common fixed terminal which has one end 43a to which an end 44a to a tongue 44 formed integrally with movable contact member 37 by cutting same is fixed, and has the other end 43b by which a compression spring 45 constituting a reversing spring is supported at its base 45b in a hinged manner. Compression spring 45 is engaged at its end 45a with an end 37a of movable contact member 37, so that movable contact member 37 is held in a tense state.

The base 37b of movable contact member 37 and an end 3a of bimorph cell are connected via a connection member 15 to each other. Reference numerals 46, 47 denote stops which are positioned on the return and operate sides of movable contact member 37 and abut against movable end 3a of bimorph cell 3 which is supported at one end 3b so as to restrict deformation of bimorph cell 3.

FIG. 2 shows an example of prior art drive devices of this type. In FIG. 2 bimorph cells 3 are connected in parallel via a current limiting resistor 2 between a pair of input terminals 1a and 1b. Reference numeral 4 denotes a discharge resistor connected in parallel between input terminals 1a and 1b.

In the above structure, if no voltage is applied to bimorph cells 3, bimorph cells 3 extend horizontally, as shown in FIG. 1(a). Thus end portion 37a of movable contact member 37 is biased by a compression spring 45 toward fixed contact 39, so that movable contact member 40 is moved away from fixed contact 38 and closed against fixed contact 39.

Now, when an input voltage is applied across the pair of input terminals 1a, 1b in FIG. 2, the input voltage is applied via current limiting resistor 2 to electrostrictive element 3. At this time, the input current is limited by resistor 2. Electrostrictive element 3 produces a strain in accordance with the magnitude of the input voltage and bimorph cell 3 is bent in the direction of the arrow a with a fixed member 34 as the supporting point, as shown in FIG. 1(b). When base 37b of movable contact member 37 moves beyond a change point c by bend of bimorph cell 3, the spring force of compression spring 45 acts in the reverse direction to move movable contact member 40 away from fixed contact 39 and to the fixed contact 38.

When the input voltage is shut off, the electric charges stored at electrostrictive element 3 discharge via discharge resistor 4, so that electrostrictive element 3 returns to its initial state shown in FIG. 1(a). By this return, the base 37b of movable contact member 37 moves beyond change point c, the spring force of compression spring 45 acts to move movable contact member 40 away from fixed contact 38 and to fixed contact 39.

Figure 10:
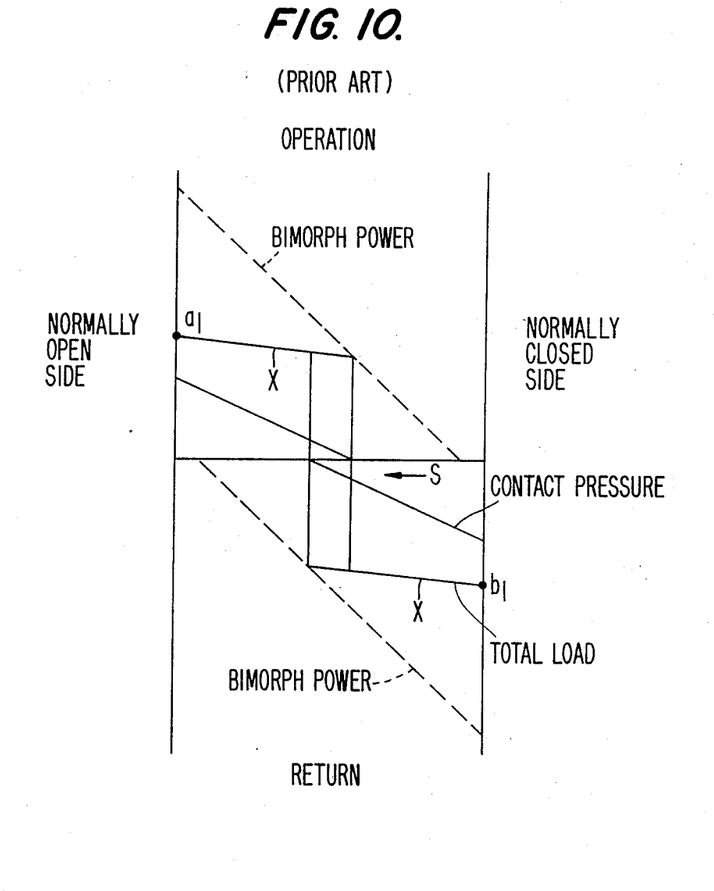
FIG. 10 is a graph illustrating the operation-return characteristic of the prior art electromechanical transducer-type relay.

In order to maintain the deviation of electrostrictive element 3, a voltage must continuously be applied to electrostrictive element 3. If the deviation of electrostrictive element 3 is maintained like this, electrostrictive element 3 will be disadvantageously deformed plastically. The load characteristic x of the snap action mechanism has a linearity with stroke s shown in FIG. 10, the holding forces a1, b1 of the contacts become relatively small, and large contact pressure is not obtained between movable and fixed contacts 40 and 38, and between movable and fixed contacts 40 and 39. Thus vibrations and/or shocks may cause the closed contacts to easily open to thereby result in an erroneous operation of the device. Especially when the contacts 38, 39 and 40 are worn, their pressures are further decreased, the contacts are significantly worn when large currents flow through the contacts, thereby shortening the life of the contacts.

The above is a common defect occurring when elements such as piezoelectric elements, not electrostrictive elements, which produce a strain due to application of an electric field are used as electromechanical transducer elements 3.

SUMMARY OF THE INVENTION

This invention is made to eliminate the above drawbacks. It is an object of this invention to provide an electromechanical transducer type relay which is capable of displacing a bimorph cell with a low power consumption without deforming the bimorph cell plastically, and which is free from easy opening of contacts and hence erroneous operation by vibrations and shocks and which accomplishes prolongation of the life of the contacts.

An electromechanical transducer type relay according to this invention is characterized by a bimorph cell which includes an operation electromechanical transducer element and a return electromechanical transducer element, a drive circuit which applies a one-shot pulse to each of the operation and return electromechanical transducer elements to reciprocate the bimorph cell, a movable contact member and fixed terminals being each composed of a magnetic material, a permanent magnet for attracting and holding said movable member in contact with a fixed terminal on its operation side or on its return side, and a connection member connecting the respective ends of the bimorph cell and movable contact member so that when the bimorph cell is displaced, the movable contact member is displaced toward its operation side or toward its return side while when the bimorph cell returns to its initial state, the movable contact member is held in its operation state or in its return state.

Another embodiment of an electromechanical transducer type relay according to this invention is characterized by a bimorph cell which includes an operation electromechanical transducer element and a return electromechanical transducer element, a drive circuit which applies a one-shot pulse to each of the operation and return electromechanical transducer elements to reciprocate the bimorph cell, the movable contact member and the fixed terminal being each composed of a magnetic material, a pair of yokes, one disposed at a predetermined spacing from and opposed to each of the sides of a movable contact member of a magnetic material, a permanent magnet for attracting and holding said movable member to the corresponding yoke on its operation side or on its return side, fixed terminals to and away from which movable contacts of said movable contact member move, and a connection member connecting the respective ends of the bimorph cell and movable contact member so that when the bimorph cell is displaced, the movable contact member is displaced toward its operation side or toward its return side while when the bimorph cell returns to its initial state, the movable contact member is held in its operation state or in its return state.

By the above structure, the bimorph cell is impressed with a voltage only for a predetermined time on impression and interruption of the input voltage to return at once to its initial state, so that it is displaced with low power consumption with no plastic deformation.

The relation between attractive force by the permanent magnet and stroke has a square characteristic, the holding force between the contacts becomes very large, and the closed contacts will not be easily opened and/or erroneously operated by vibration and/or shocks.

Further, even if the contacts are worn, the attractive force by the permanent magnet causes the contacts of said movable contact member to be pressed against the corresponding fixed contact to thereby assure the contact pressure at all times, reduce the abrasion of the contacts even when a large current flows through the contacts, and accomplish prolongation of the life of the contacts.

DESCRIPTION OF THE PREFERRED EMBODIMENTS

Figure 4A:
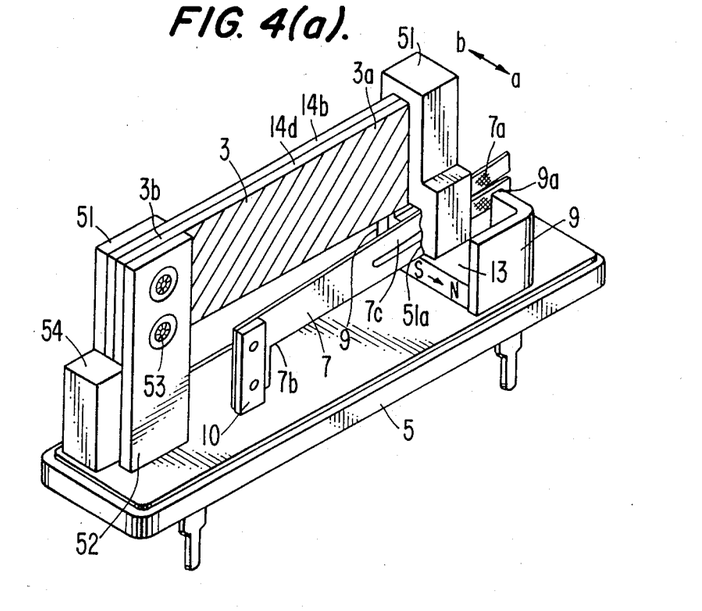
FIGS. 4(a) and 4(b) are perspective views showing an electromechanical transducer-type relay according to this invention.
Figure 4B:
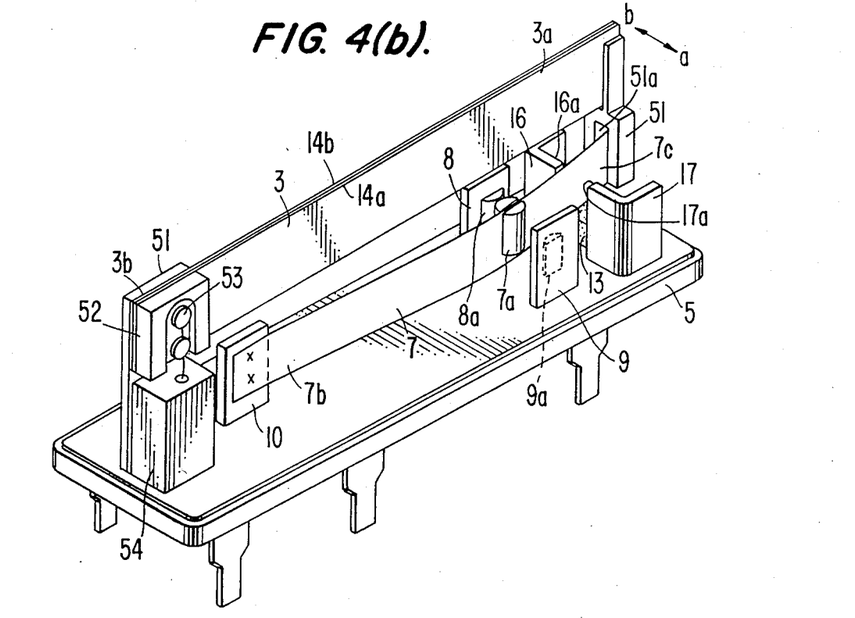

FIGS. 4(a) and (b) show an electromechanical transducer type relay according to this invention.

Figure 3:
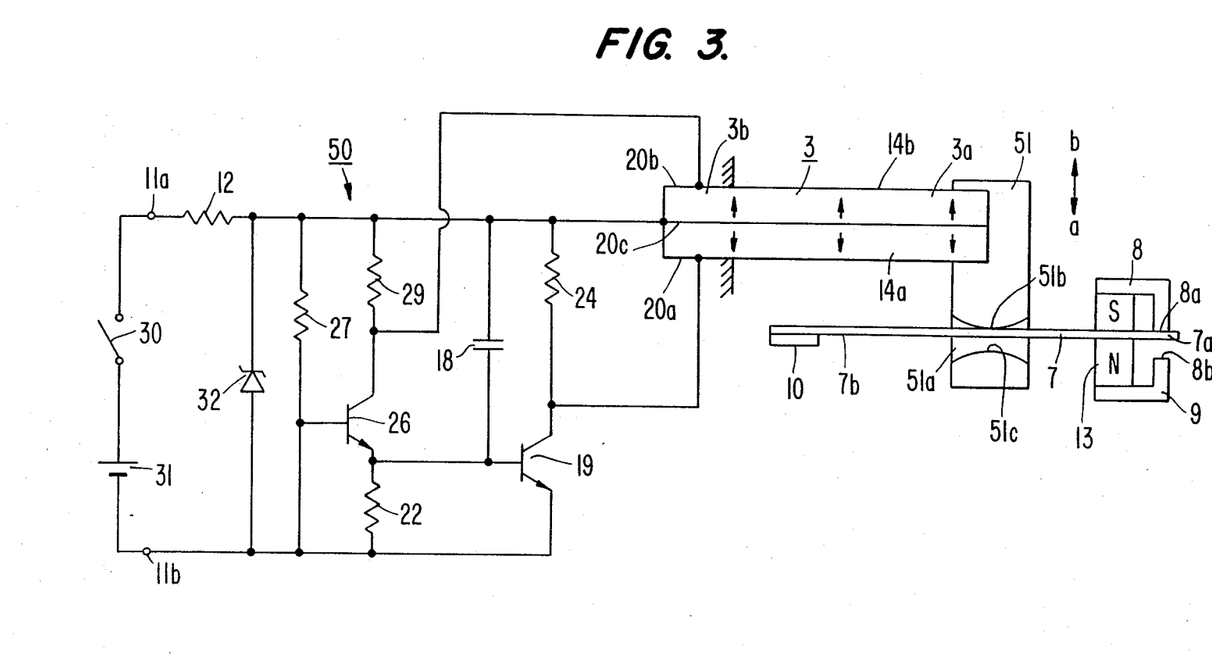
FIGS. 3 and 6 are electric circuit showing examples of a drive circuit of the electromechanical transducer-type relay according to this invention.
Figure 6:
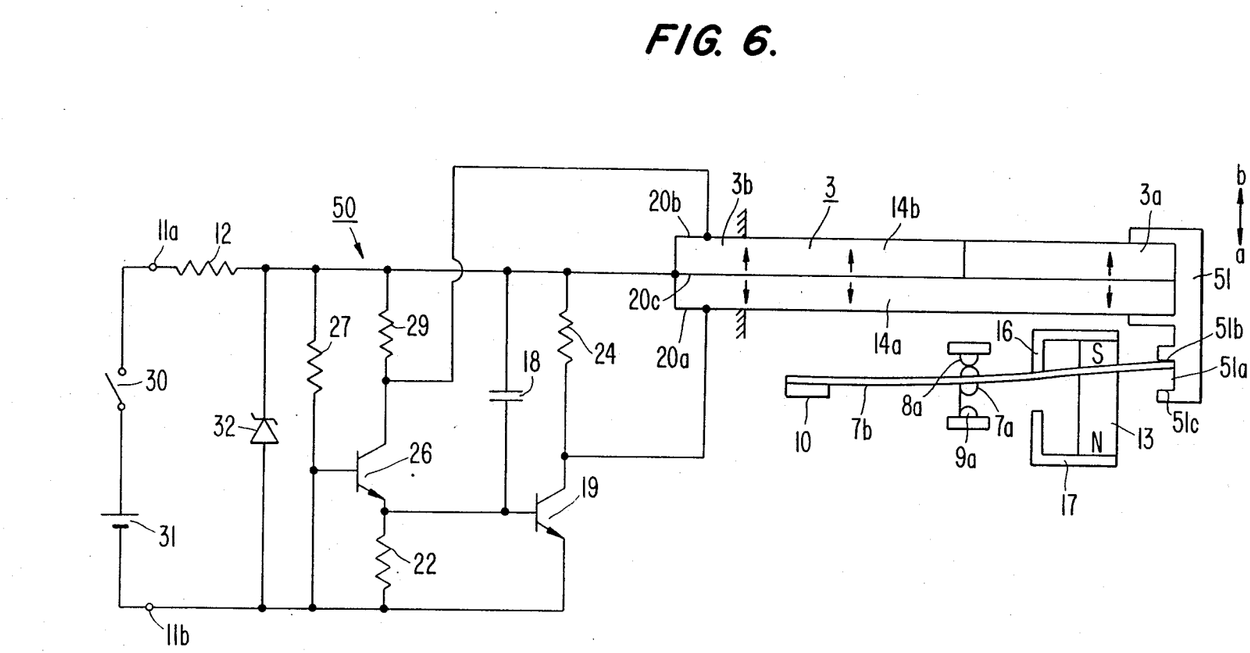

Reference 3 denotes a bimorph cell which includes a pair of joined dielectric electromechanical transducer elements, for example, electrostrictive elements 14a and 14b, so that their polarizing directions differ to thereby produce distortions in different directions, as shown in FIGS. 3 and 6. The bimorph cell is fixed at its base 3b in a cantilevered manner. Namely, one electrostrictive element 14a constitutes an operation electrostrictive element while the other electrostrictive element 14b constitutes a return electrostrictive element.

The bimorph cell 3 is cantilevered at its base 3b by a fastening member 53 via an auxiliary plate 52 to an electrically conductive member 51 secured to base 5. It is electrically connected to a printed board (not shown) incorporated in an electric circuit within an insulator 54. When a voltage is applied to bimorph cell 3, movable end 3a of bimorph cell 3 is bent with conductive members 35, 36 (see FIG. 3) and 51 (see FIG. 6) as supporting points in the direction of the arrow a or b.

Figure 5A:
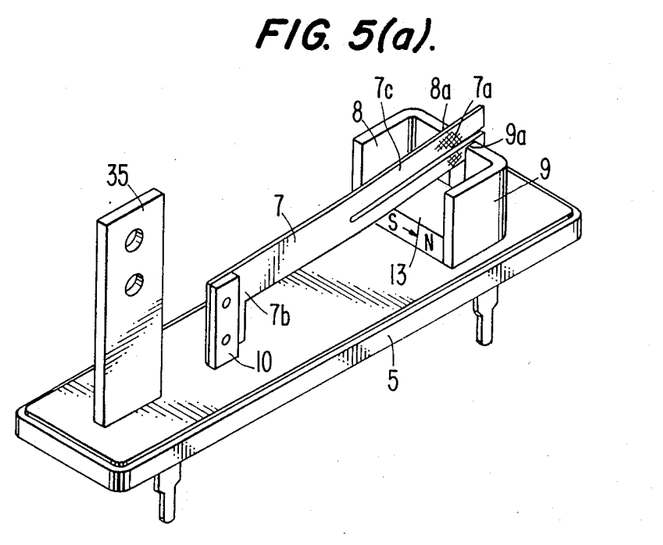
FIGS. 5(a) and 5(b) are perspective views of an essential portion of the electromechanical transducer-type relay according to this invention.
Figure 5B:
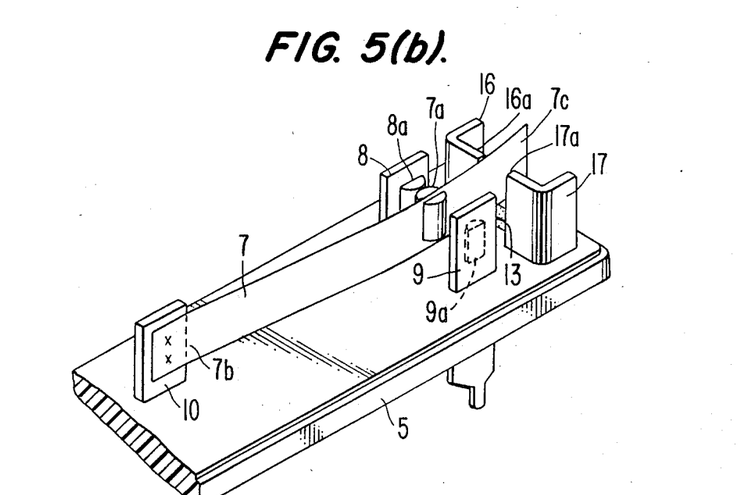

Reference numeral 7 denotes a movable contact member fixed at its base 7b to a common fixed terminal 10. Movable contact member 7 has at an end a movable contact member 7a which can move to and away from fixed contacts 8a, 9a formed on opposing end surfaces of fixed terminals 8, 9 as shown in FIGS. 5(a) and 5(b).

Movable contact member 7 and fixed terminals 8, 9 are each composed of an electrically conductive magnetic material. A permanent magnet 13 is provided between fixed terminals 8 and 9. The middle portion 7c of movable contact member 7 and end portion 3a of bimorph cell 3 are connected via recess 51a in connection member 51 to each other.

FIGS. 3 and 6 shows one example of a drive circuit 50 for the electromechanical transducer type relay according to this invention.

In FIGS. 3 and 6, bimorph cells are connected in parallel via a current-limiting resistor 12 across a pair of input terminals 11a and 11b.

Reference numeral 18 denotes a capacitor connected across the input terminals and is charged when the input voltage is applied across the input terminals. Reference numeral 19 denotes a first switching element which includes, for example, a transistor.

A common electrode 20c to bimorph cells 3 is connected via a current limiting resistor 12 to one input terminal 11a. The other electrode 20a of operation electrostrictive element 14a is connected to the collector of first transistor 19, the base of which is connected via a resistor 22 to other input terminal 11b. Capacitor 18 is also connected across the base of first transistor 19 and input terminal 11a. Resistor 22 is used to drive first transistor 19 while resistor 24 is used for the discharge of operation electrostrictive element 14a.

On the other hand, the other electrode 20b of return electrostrictive element 14b is connected to the collector of a second transistor 26, the base of which is connected to input terminal 11b. A resistor 27 is connected across the base of transistor 26 and input terminal 11a to drive second transistor 26. Reference numeral 29 denotes a discharge resistor for return electrostrictive element 14b.

A direct current power source 31 is connected via a switch 30 across the pair of input terminals 11a and 11b. A constant-voltage diode 32 is connected in parallel with resistor 27.

Now the operation of the above structure will be described.

When switch 30 is closed and direct current power source 31 applies an input voltage across the pair of input terminals 11a and 11b, a charging current flows via current limiting resistor 12 to capacitor 18 to charge same while a base current flows to first transistor 19 to turn on same.

When first transistor 19 is turned on, a voltage is applied to operation electrostrictive element 14a. Since operation electrostrictive element 14a is a kind of capacitor, the charging current to element 14a flows through the path: input terminal 11a-current limiting resistor 12-operation electrostrictive element 14a-first transistor 19-input terminal 11b.

When operation electrostrictive element 14a is shrunk, the other or return electrostrictive element 14b is also bent in the direction of the arrow a. When charging of capacitor 18 is completed, no current is supplied to the base of first transistor 19 which then turns off. When first transistor 19 turns off, operation electrostrictive element 14a is short-circuited via resistor 24, the charging current to the element 14a flows via resistor 24 and bimorph cell 3 returns to its initial state.

Figure 7A:
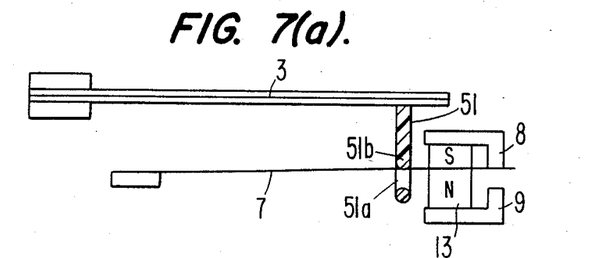
FIGS. 7(a)–7(d) are diagrammatic views showing the operation and return of the electromechanical transducer-type relay according to this invention.
Figure 7B:
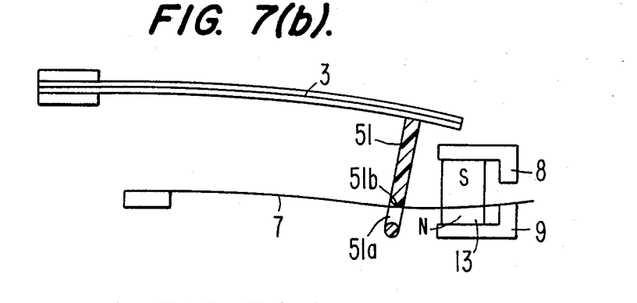
Figure 11A:
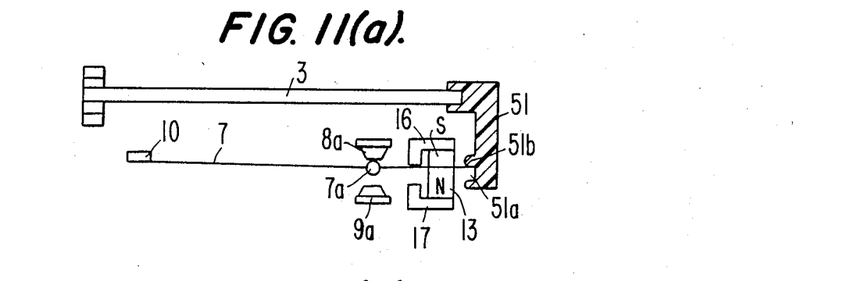
FIGS. 11(a)–11(d) are diagrammatic views showing the operation and return of the electromechanical transducer-type relay according to another embodiment of this invention.
Figure 11B:
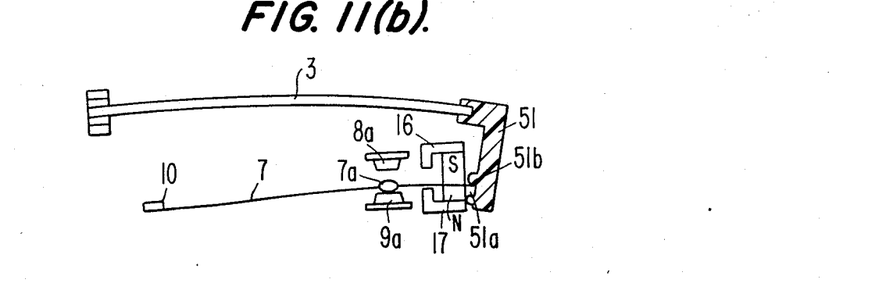

When bimorph cell 3 is bent toward its operation side, a step 51b in connection member 51 provided at the end of bimorph cell 3 displaces movable contact member 7 from the position shown in FIGS. 7(a) and 11(a) to the position of FIGS. 8(b) and 11(b), respectively, to render movable contact member 7 operative. Thus although bimorph cell 3 returns to its initial state, a gap due to recess 51a formed in connection member 51 and the magnetic attractive force by permanent magnet 13 cooperate to hold movable contact member 7 in its operated state of FIGS. 7(c) and 11(c). It is to be noted that when the input voltage is applied from direct current power source 31 across input terminals 11a and 11b, second transistor 26 is off.

Next when switch 30 is opened and the input voltage from direct current power source 31 applied across input terminals 11a and 11b is interrupted, a charging current from capacitor 18 flows via resistor 27 to the base of second transistor 26 to turn on same.

When second transistor 26 is turned on, the charge voltage stored across capacitor 18 is applied to return electrostrictive element 14b and a charging current from capacitor 18 charges return electrostrictive element 14b. As a result the return electrostrictive element 14b is shrunk and the other or operation electrostrictive element 14a is bent in the direction of the arrow b. The discharge from capacitor 18 is completed, no current is supplied to the base of second transistor 26 to turn off same. When second transistor 26 is turned off, return electrostrictive element 14b is short-circuited via resistor 29 and this charging current flows through resistor 29. Thus the bimorph cell 3 returns to its initial state.

Figure 7C:
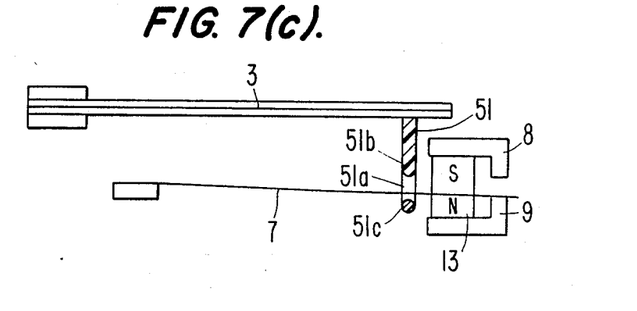
Figure 7D:
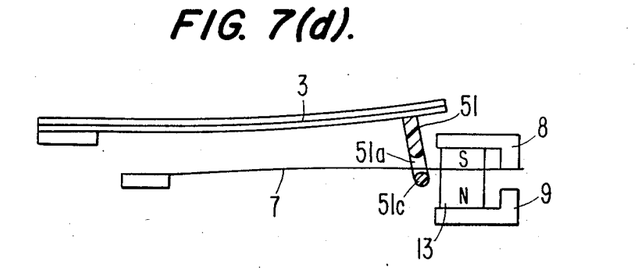
Figure 11C:
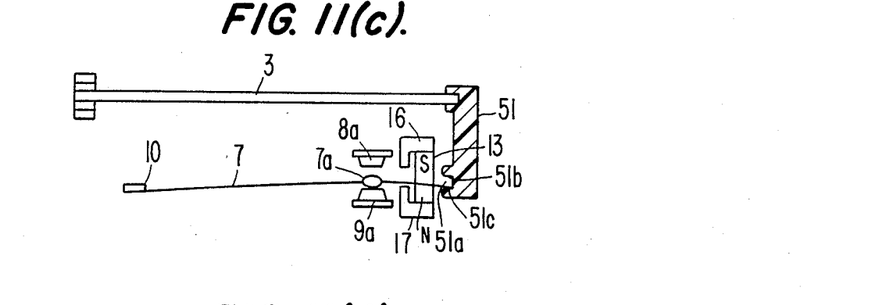
Figure 11D:
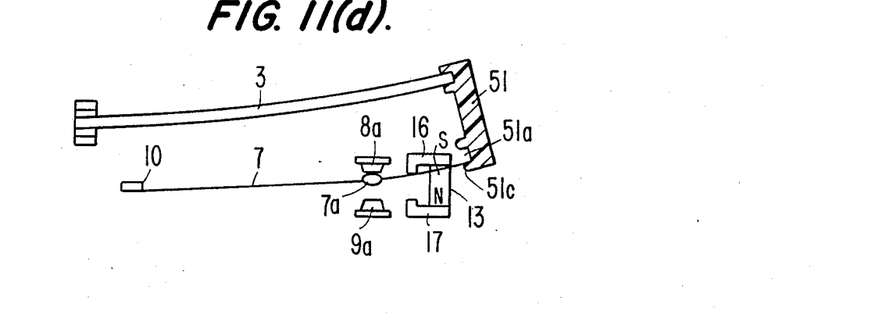

When bimorph cell 3 is bent toward its return side, the step 51c in connection member 51 provided at the end of bimorph cell 3 displaces movable contact member 7 from the position of FIGS. 7(c) and 11(c) to the position of FIGS. 8(d) and 11(d), respectively, to put movable contact member 7 in its returned state. Although bimorph cell 3 returns to its initial state, the gap due to recess 51a formed at connection member 51 and the magnetic attractive force due to permanent magnet 13 cooperate to attract and hold movable contact member 7 in its returned state of FIGS. 7(a) and 11(a). It is to be noted that when no input voltage from direct current power source 31 is applied across input terminals 11a and 11b, first transistor 19 is off.

Figure 8:
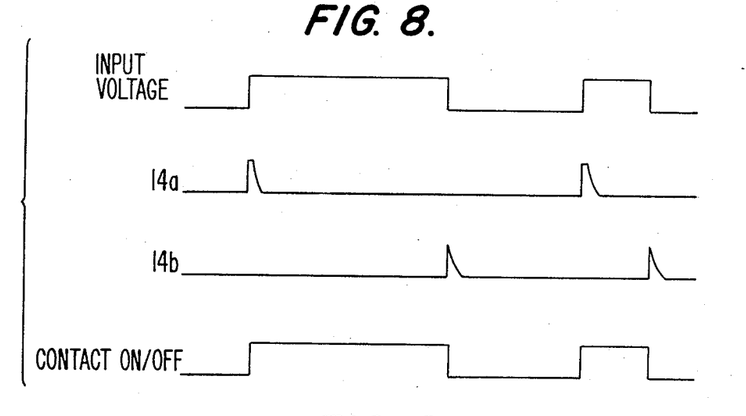
FIG. 8 is a timing chart for illustrating the operation of the electromechanical transducer-type relay according to this invention.
Figure 9:
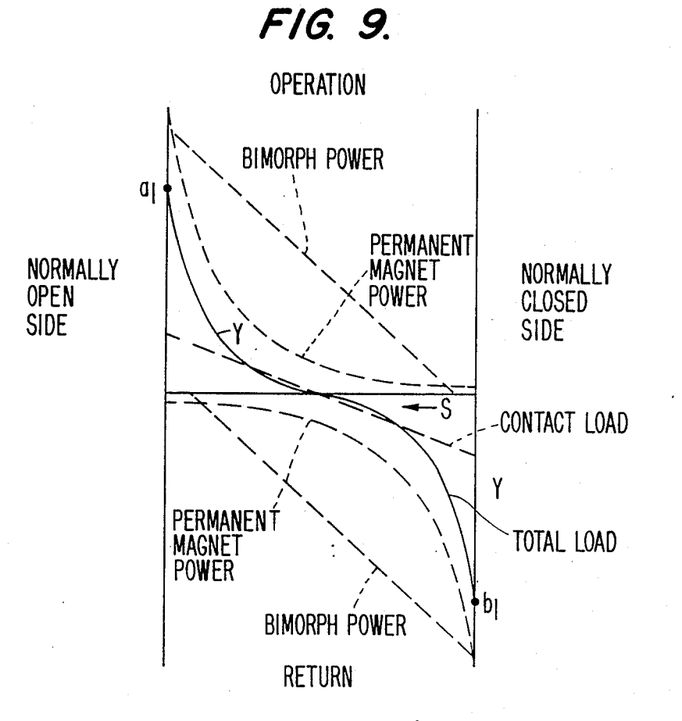
FIG. 9 is a graph illustrating an operation-return characteristic of the electromechanical transducer-type relay according to this invention.

As described above, the operations of the respective sections of the circuit shown in FIGS. 3 and 6 are as shown in the timing chart of FIG. 8. FIG. 9 shows the operation-return characteristic of the relay.

As described above, when contact 7a is opened and closed, it is unnecessary to continuously apply a voltage to electrostrictive elements 3, so that there is no danger that electrostrictive elements 3 are deformed plastically. Thus electrostrictive elements 3 can have a long service life. The relationship between attractive force by permanent magnet 13 and stroke S has a square characteristic, the holding forces a1 and b1 on contact 7a become very large, and large contact pressure between each of fixed contacts 8a, 9a and movable contact members 7a is obtained. Thus, there is no probability that the respective closed contacts will easily be opened and operated erroneously due to vibration and/or shocks.

By adjustment of the attractive force by permanent magnet 13, the hold forces a1, b1 on contacts 7a can be easily adjusted.

Even if contacts 7a, 8a, 9a are worn, the magnetic attractive force by permanent magnet 13 causes movable contact 7a of the contact member 7 to be pressed against fixed contacts 8a, 9a to thereby assure the contact pressures at all times, reduce the abrasion of the contacts even when a large current flows through the contacts, and accomplish prolongation of the life of the contacts.

Figure 12:
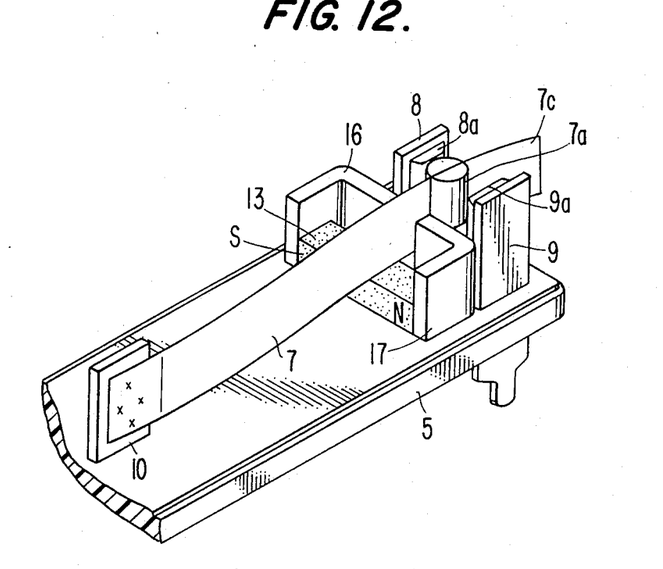
FIG. 12 is a perspective view of a portion of another embodiment of an electromechanical transducer-type relay according to this invention.

FIG. 12 is the essential portion of another example of the electromechanical transducer type relay according to this invention. While yokes 16, 17 are disposed between fixed terminals 8, 9 and connection member 51 in FIG. 6, yokes 16, 17 may be disposed between 8, 9 and a common fixed terminal 10.

While in the above embodiment the electrostrictive element 14a, 14b are described as an example of bimorph cell 3, a similar effect may be obtained by other elements such as piezoelectric elements which produce strains when subjected to electric field.

The above description is included to illustrate the operation of the preferred embodiments and is not meant to limit the scope of the invention. The scope of the invention is to be limited only by the following claims. From the above-discussion, many variations are apparent to one skilled in the art which would be encompassed by the spirit and scope of the invention.

What is claimed is:

1. An electromechanical transducer type relay comprising a bimorph cell having a pair of joined dielectric electromechanical transducer elements which, when subjected to an electric field, generate strains in different directions to be displaced toward the operation and return sides of said bimorph cell; a movable contact member of a magnetic material; fixed terminals of a magnetic material to and away from which said movable contact member moves; a permanent magnet for attracting and holding said movable contact member so that said movable contact member contacts said fixed terminal on its operation side or on its return side; a connection member provided at a movable end of said bimorph cell for displacing said movable contact member toward its operation side or toward its return side when said bimorph cell is displaced, said connection member having an aperture therein allowing said movable contact member to remain in its operation state or in its return state when said bimorph cell has returned to its initial state; and a drive circuit for reciprocating said bimorph cell by applying a one-shot pulse to each of said bimorph cell operation and return electromechanical transducer elements.

2. An electromechanical transducer type relay comprising a bimorph cell having a pair of joined dielectric electromechanical transducer elements which, when subjected to an electric field, generate strains in different directions to be displaced toward the operation and return sides of said bimorph cell; a movable contact member of a magnetic material fixed at its base so as to be cantilevered; fixed terminals having fixed contacts to and away from which said movable contact member moves; a pair of yokes of a magnetic material, one displaced at a predetermined spacing from and opposite to each of the sides of said movable contact member; a permanent magnet for attracting and holding said movable contact member so that said movable contact member contacts the corresponding yoke on its operation side or on its return side; a connection member provided at a movable end of said bimorph cell for displacing said movable contact member toward its operation side or toward its return side when said bimorph cell is displaced, said connection member having an aperture therein allowing said movable contact member to remain in its operation state or in its return state when said bimorph cell has returned to its initial state; and a drive circuit for reciprocating said bimorph cell by applying a one-shot pulse to each of said bimorph cell operation and return electromechanical transducer elements.

3. An electromechanical transducer type relay of claim 2, wherein said yokes are disposed between said fixed terminals and said connection member.

4. An electromechanical transducer type relay of claim 2, wherein said yokes are disposed between said fixed terminals and a common fixed terminal at the base of said movable contact member.

5. An electromechanical transducer type relay of claim 1 wherein said drive circuit includes a capacitor connected to an input terminal and charged when a voltage is applied to said input terminal; a first switching element conducting from the application of the input voltage until the charging of said capacitor is completed to supply electric power to said bimorph cell operation electromechanical element displaced toward its operation side; and a second switching element conducting from the interruption of said input voltage until said capacitor completes its discharging to supply electric power to said bimorph element return electromechanical transducer element displaced toward its return side.

* * * * *